(12) United States Patent
Priya et al.

(10) Patent No.: US 7,649,305 B2
(45) Date of Patent: Jan. 19, 2010

(54) PIEZOELECTRIC ENERGY HARVESTER

(75) Inventors: Shashank Priya, Arlington, TX (US);
Robert D. Myers, Arlington, TX (US)

(73) Assignee: Board of Regents, the University of Texas System, Austin, TX (US)

( * ) Notice: Subject to any disclaimer, the term of this patent is extended or adjusted under 35 U.S.C. 154(b) by 0 days.

(21) Appl. No.: 12/057,107

(22) Filed: Mar. 27, 2008

(65) Prior Publication Data

US 2008/0174273 A1 Jul. 24, 2008

Related U.S. Application Data

(63) Continuation of application No. 11/527,044, filed on Sep. 26, 2006, now abandoned.

(51) Int. Cl.
*H01L 41/113* (2006.01)
(52) U.S. Cl. ...................................................... 310/339
(58) Field of Classification Search .................. 310/339
See application file for complete search history.

(56) References Cited

U.S. PATENT DOCUMENTS

| 4,467,236 | A | * | 8/1984 | Kolm et al. | 310/321 |
|---|---|---|---|---|---|
| 5,801,475 | A | * | 9/1998 | Kimura | 310/319 |
| 5,977,690 | A | * | 11/1999 | Ellis et al. | 310/330 |
| 6,252,336 | B1 | | 6/2001 | Hall | 310/339 |
| 6,308,356 | B1 | * | 10/2001 | Frederick et al. | 8/158 |
| 6,954,025 | B2 | | 10/2005 | Nishida et al. | 310/339 |
| 7,239,066 | B2 | * | 7/2007 | Ott et al. | 310/339 |
| 2005/0017602 | A1 | * | 1/2005 | Arms et al. | 310/339 |

FOREIGN PATENT DOCUMENTS

| JP | 11-303726 | 11/1999 |
|---|---|---|
| JP | 2001-204507 | 7/2001 |
| JP | 2005-237156 | 9/2005 |
| WO | WO 2006-102437 | 9/2006 |

* cited by examiner

*Primary Examiner*—Thomas M Dougherty
(74) *Attorney, Agent, or Firm*—J. Peters Paredes; Rosenbaum & Silvert, P.C.

(57) ABSTRACT

A mechanism for capturing mechanical energy and converting it to electrical energy for use continually charging or providing emergency power to mobile, battery-powered devices comprises a plurality of elongated piezoelectric elements mounted at one or support points to one or more support structures. The plurality of piezoelectric elements are preferably structured and arranged so that at least each three-dimensional coordinate axis has at least one element with a dominant mode of deflection in a plane normal to the axis, in order to permit harvesting energy from forces applied in any direction without regard to the orientation of the energy harvesting mechanism to the source of forces. This results in improved coupling of the transducer with the random movements or vibrations that may not confined to any particular plane or in a plane that is not necessarily aligned with the plane in which a piezoelectric element is designed to bend, thus improving the efficiency of energy capture.

18 Claims, 8 Drawing Sheets

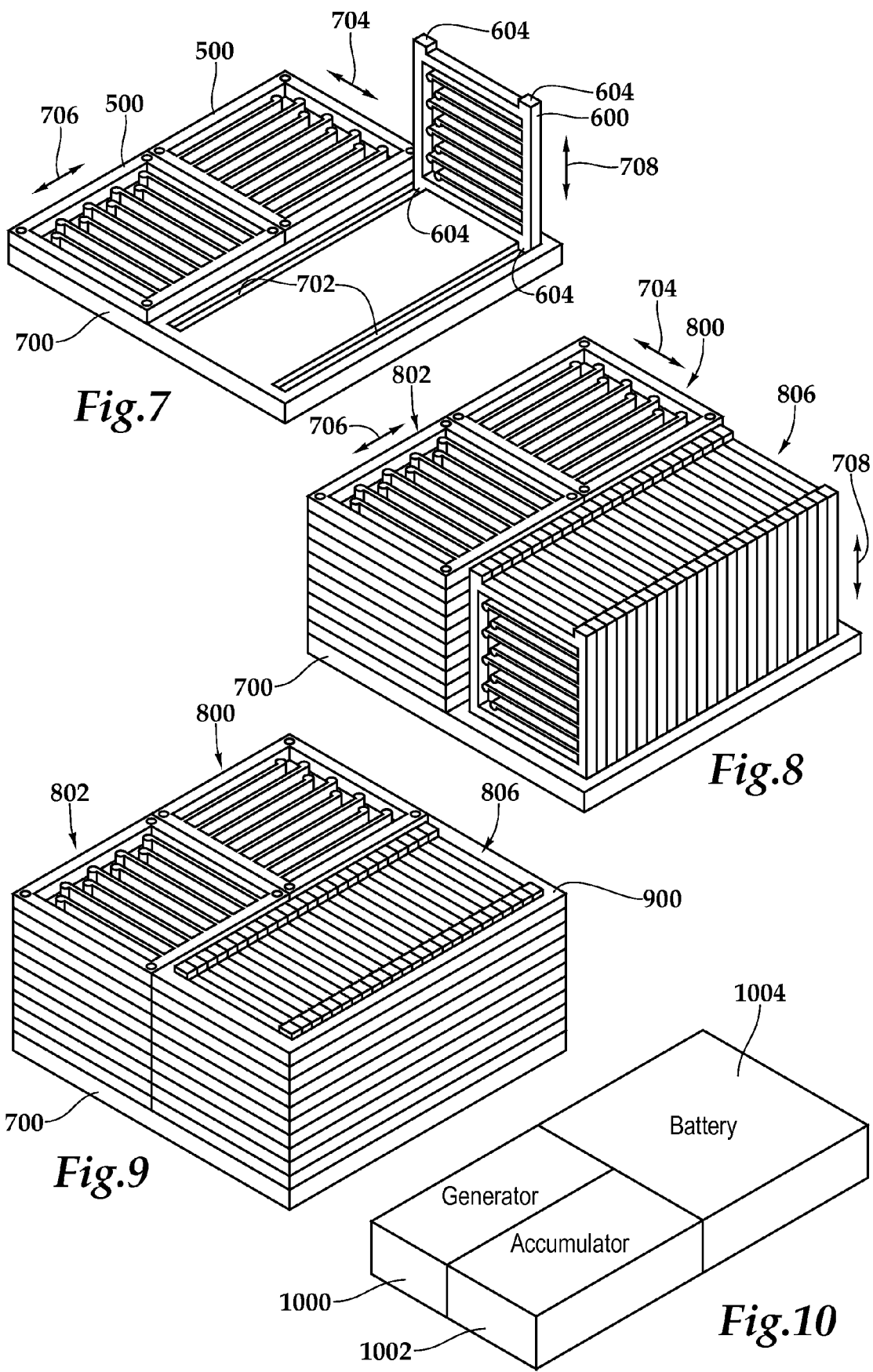

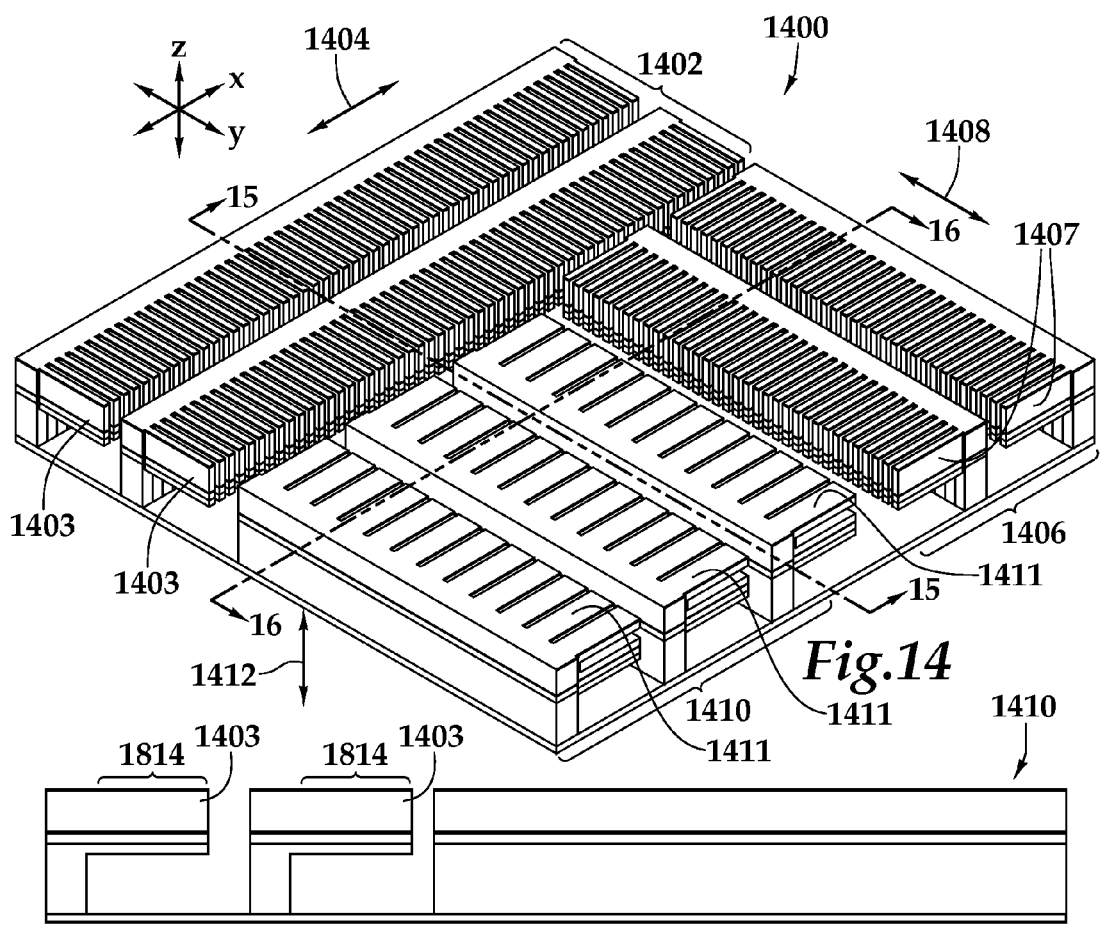
*Fig.14*
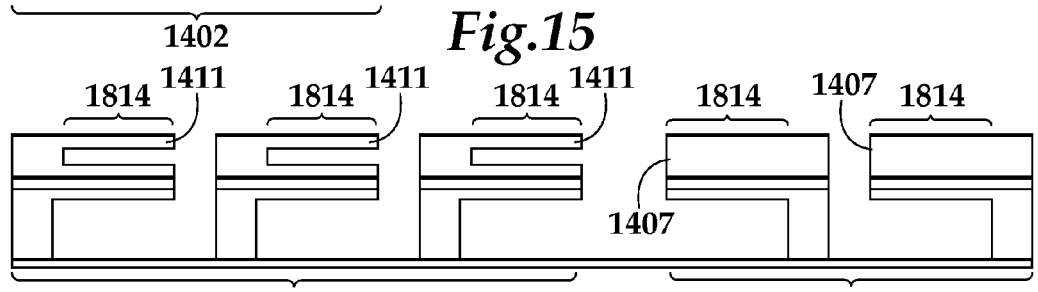
*Fig.15*
*Fig.16*
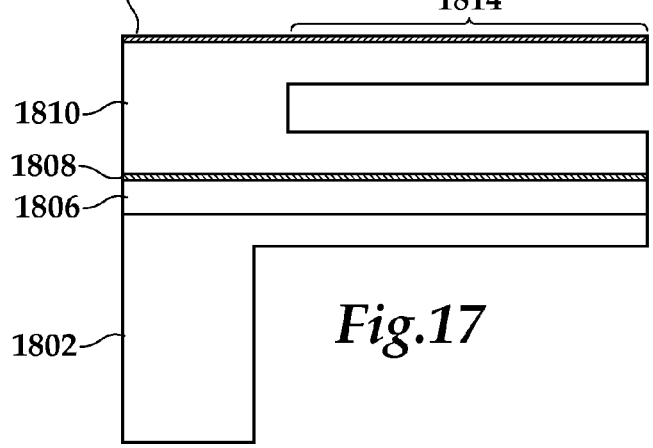
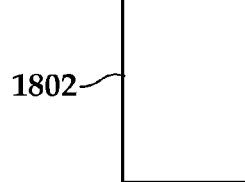
*Fig.17*

PIEZOELECTRIC ENERGY HARVESTER

CROSS-REFERENCE TO RELATED APPLICATION

This application is a continuation of U.S. application Ser. No. 11/527,044, filed Sep. 26, 2006, now abandoned which is incorporated herein by reference for all purposes.

BACKGROUND OF THE INVENTION

Unused power exists in various forms such as industrial machines, human activity, vehicles, structures and environment sources. Among these, some of the promising sources for recovering energy are periodic vibrations generated by rotating machinery or engines. Primarily, the selection of the energy harvester as compared to other alternatives such as battery depends on two main factors cost effectiveness and reliability. In recent years, several energy harvesting approaches have been proposed using solar, thermoelectric, electromagnetic, piezoelectric, and capacitive schemes which can be simply classified in two categories (i) power harvesting for sensor networks using MEMS/thin/thick film approach, and (ii) power harvesting for electronic devices using bulk approach.

Promising applications for piezoelectric energy harvesting have inherent forms of energy to capture, store and use. Examples include "active" sports equipment such as tennis racquets and skis that use strain to power actuators for feedback control loops, and watches that use body motion to supply power. Other applications which have been suggested include the use of aircraft engine vibrations, airflow over wings, vibrations induced by driving on a road, and periodic vibrations generated by rotating machinery or engines. Primarily, the selection of the energy harvester as compared to other alternatives such as battery depends on three main factors, cost effectiveness, profile and reliability. In an other form, the energy harvester can supplement the other energy alternatives such as battery and prolong their lifetime.

Conversion of mechanical low frequency stress into electrical energy is obtained through the direct piezoelectric effect, using a rectifier and DC-DC converter circuit to store the generated electrical energy. There are three primary steps in power generation: (a) trapping mechanical AC stress from available source, (b) converting the mechanical energy into electrical energy with piezoelectric transducer and (c) processing and storing the generated electrical energy. The mechanical output can be in the form of a burst or continuous signal depending on the cyclic mechanical amplifier assembly. Depending on the frequency and amplitude of the mechanical stress, one can design the required transducer, its dimensions, vibration mode and desired piezoelectric material. The energy generated is proportional to frequency and strain and higher energy can be obtained by operating at the resonance of the system.

SUMMARY OF THE INVENTION

The invention pertains generally to a mechanism for capturing mechanical energy and converting it to electrical energy, and is particularly useful for continually charging or providing emergency power to mobile, battery-powered devices that are hand-held or carried by persons. The mechanism comprises a plurality of elongated piezoelectric elements for generating electric energy from mechanical energy.

In one exemplary embodiment, the piezoelectric elements are mounted to one or more support structures in a cantilevered fashion, with a single point of support, such as one end supported or fixed and an opposite end free to move relative to the fixed end within a predetermined plane relative to the support structures. In another exemplary embodiment, the piezoelectric elements are supported at two or more fixed points of support, with the element free to bend between the points of support and within a predetermined plane relative to the fixed points of support.

In each exemplary embodiment, the plurality of piezoelectric elements are preferably arranged so that at least each three-dimensional coordinate axis (e.g. x, y and z) has at least one element that is structured and oriented to bend or flex predominantly in a plane normal to the axis, allowing harvesting of energy from forces applied in any direction without regard to the orientation of the energy harvesting mechanism to the forces. This arrangement results in improved coupling of the transducer with the random movements or vibrations that may not be confined to any particular plane or in a plane that is not necessarily aligned with the plane in which a piezoelectric element is designed to bend, thus improving the efficiency of energy capture.

BRIEF DESCRIPTION OF THE DRAWINGS

FIG. 7 illustrates assembly of the arrays of FIGS. 5 and 6 into a compact energy harvesting mechanism or generator.

FIG. 8 illustrates further assembly of the generator of FIG. 7.

FIG. 9 illustrates a nearly complete assembly of the generator of FIGS. 7 and 8, without a cap enclosing the assembly.

FIG. 10 is a schematic illustration of a generator, such as the one shown in FIGS. 7-9, as part of a charging apparatus for a battery for a mobile device.

FIG. 14 illustrates schematically an orthographic view of an example of a piezoelectric energy harvesting mechanism formed on a monolithic substrate.

FIG. 15 is a cross-sectional view of the energy harvesting mechanism of FIG. 14, taken along section lines 15-15.

FIG. 16 is a cross-sectional view of the energy harvesting mechanism of FIG. 14, taken along section lines 16-16.

FIG. 17 is a cross-sectional view of one piezoelectric element of the energy harvesting mechanism of FIG. 14.

DESCRIPTION OF PREFERRED EMBODIMENTS

In the following description, like numbers refer to like parts.

Figure 1:
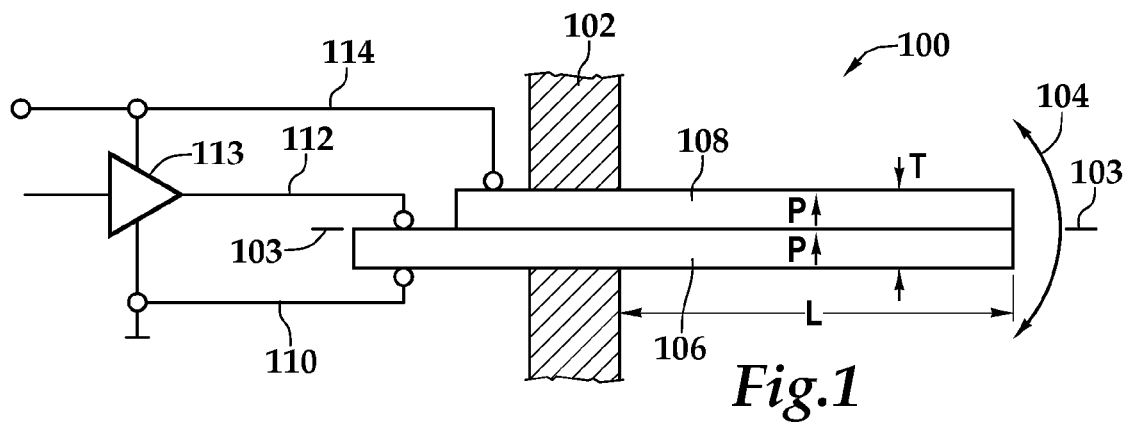
FIG. 1 is a schematic diagram of a cantilevered piezoelectric parallel bimorph element.
Figure 2:
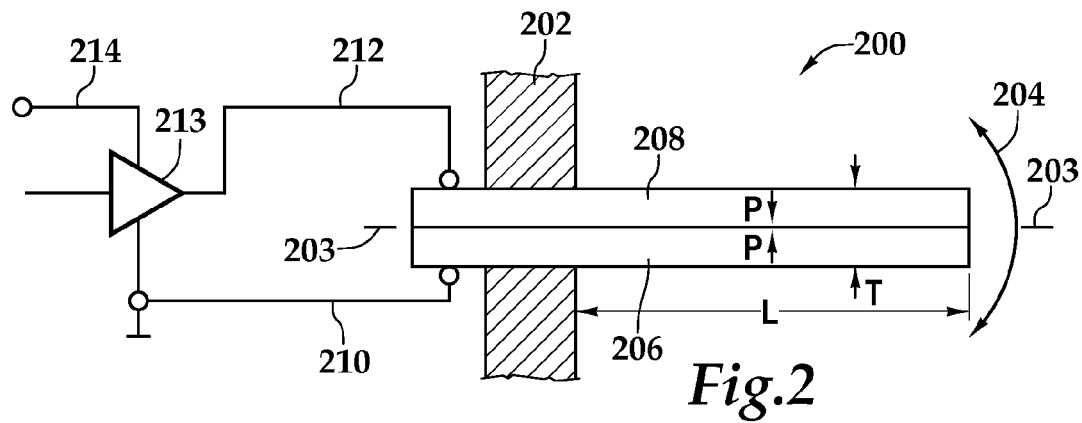
FIG. 2 is a schematic diagram of a cantilevered piezoelectric serial bimorph element.

FIGS. 1 and 2 each illustrate schematically cantilevered piezoelectric elements, each comprised of a piezoelectric transducer for generating a voltage in response to mechanical strain of the transducer. Each piezoelectric element 100 and 200 is elongated and is mounted to a structure 102 and 202, respectively in a cantilevered fashion. Each has a length L and an axis 103 and 203, respectively, extending along its length. Each element is anchored near one end of its length to a structure, and its opposite end left free. Forces applied to the element, in a direction generally normal to its axis, will tend to bend and thus strain the element, generating a voltage across the element generally in a plane defined by the force and the axis of the element. Although not shown, each element has substantially larger width as compared to its thickness so that it tends to bend more easily in a plane indicated by arrows 104 and 204, as compared to other directions, thus making it more sensitive to vector forces within that plane, particularly ones that are normal or near normal to the axis.

Each of the piezoelectric elements shown in FIGS. 1 and 2, as well as those shown in the remaining figures, is preferably elongated and relatively flat, so that it deflects and resonates predominately in a single plane that contains the axis of its predominate dimension and the vector forces that cause deflection of the element. This mode of deflection corresponds to the $d_{31}$ piezoelectric strain constant. It is generally preferred that the length should be at least 10 times the width, and the width should be at least 5 times the thickness of the element. This provides one dominant resonance mode associated with the length of the piezoelectric element, with other resonance modes associated with length and width relatively suppressed. This ratio of 10 to 5 to 1 ensures good frequency spacing for the resonances (including overtones) in each possible direction of deflection, which tends to avoid signals from subordinate resonance modes interfering with signals for the dominant resonant mode, resulting in more efficient conversion of kinetic energy to electrical energy.

Several types of piezoelectric materials can be employed to fabricate the piezoelectric elements of the type shown in the figures, including BaTiO3, Pb(ZrxTi1-x)O3, $(Na_xK_{1-x})NbO_3$, $(Na_{1/2}Bi_{1/2})TiO_3$, $(K_{1/2}Bi_{1/2})TiO_3$, $Pb(A_{1/3}B_{2/3})O_3$—$PbTiO_3$ (where A=Zn, Mg, Ni, and B=Nb, Ta), $Pb(Yb_{1/2}Nb_{1/2})O_3$—$PbTiO_3$, $LiNbO_3$, $AgNbO_3$, and Bi-layered structures. Solid solutions and composite formulations of these materials can also be employed to fabricate the piezoelectric elements.

In the example of FIGS. 1 and 2, piezoelectric elements 100 and 200 possess a bimorph structure, meaning that they are comprised of two layers of piezoelectric material 106 and 108, and 206 and 208, respectively. Bimorph elements tend to provide high power density and have lower resonance frequency as compared to single layer, or unimorph, piezoelectric elements. Each layer has a piezoelectric coefficient labeled as "P," which is related to piezoelectric coefficient $d_{31}$ for the material and corresponds to a bending motion. Bimorph piezoelectrics have sufficient mechanical strength for high amplitude vibrations in the range of 1-10 Hz. The applied load on the bimorph can be of the order of several Newtons of force. Laboratory scale measurements have shown that a bimorph vibrating under a force of 10 N at low frequencies of 10 Hz typically do not suffer from mechanical degradation. The piezoelectric voltage coefficient of a bimorph is high so the charge developed under fully loaded condition is high. The maximum displacement of the bimorph is significant due to the high level of bending force that can be applied. Hence, the mechanical energy obtained from the bimorph is high.

Bimorphs can be electrically driven in order to obtain the bending movement by polarizing each layer in opposite direction. In the figures, the arrows next to the "P" indicate the direction of polarization. Usually, a 3-terminal input is used for a driving power supply. FIG. 1 illustrates a parallel configuration, in which the polarization of each layer is in the same direction, and FIG. 2 illustrates a serial configuration, in which the polarization in each layer is in opposite directions. A positive side of the driver input is connected to a positive terminal of the piezoelectric transducer, a negative terminal is connected to zero, and an electrode layer is connected to alternating positive voltage or zero. In the parallel configuration, ground input 110 is connected to a bottom electrode of layer 106 and output 112 from op amp 213 is connected to middle electrode layer, between the layers. Supply voltage input 114 for the op amp is also connected to the top electrode of layer 108. In the serial configuration of FIG. 2, ground line 210 is connected to a bottom electrode of layer 206 and output 212 of op amp 213 is connected to the middle electrode. Supply voltage 214 for the op amp is not connected to the bimorph. When the middle electrode layer is at zero voltage, the middle-layer and negative terminal are isopotential and the piezoceramic at the negative side does not operate. The piezoceramic at the positive side is at the positive electric field. In this condition, by the action of converse piezoelectric effect, the ceramics is lengthened along the polarization direction (thickness or 33 orientation), which causes shortening in the transversal direction. Since the negative terminal side tightly bonded to the ceramics restricts this shortening, the positive terminal can only bend to its own side. Similarly, when the middle electrode is at the positive voltage, the negative terminal operates, which results in bending to the negative terminal side. This power-connected driving mode is referred to as a serial connection. Since a piezoceramic is a capacitive element, the electric energy absorbed in the piezoelectric ceramics will be slowly released in a short period after power off. Resistors (not shown) are connected in parallel between two electrodes to consume the absorbed energy, so that the bimorph can rapidly return to its original position after power off. A series bimorph transducer will perform better for energy harvesting application than a parallel bimorph.

The bimorph or layered piezoelectric may be fabricated using a dry sheet process or a wet build-up process. In a typical dry process, powdered ceramic material is mixed with a polymeric binder and cast onto moving belts to form green ceramic tapes. The tapes are then coated with a film of the electrode material, usually silver or a silver palladium alloy. The coated tapes are next stacked upon each other and pressed together. The final structure is sandwiched between top and bottom ceramic layers without electrodes to form a 'pad', which is diced into individual components. The components are sintered at elevated temperatures of 900 to 1,100° C. After cooling, the components are poled at high temperature and field. The poled components are then mounted on a metallic sheet in the bimorph configuration.

Each cantilevered piezoelectric element possesses a natural resonance frequency dictated at least in part by how it is supported, the materials(s) used in the element, and its length, thickness, shape, mass, and distribution of mass. Although the cross sectional shape of the element in the examples illustrated in FIGS. 1 and 2, as well as most of the other examples described below, is predominately rectangular, other cross sections could be employed. Furthermore, the mass of the element need not be distributed evenly along its length. For example, more mass, which need not necessarily be of piezoelectric material, can be concentrated in the free end or tip, thereby increasing the moment of inertia and lowering the resonance frequency. The element could also be shaped differently along its length to alter resonant characteristics or for other reasons.

Tuning the resonant frequency of a piezoelectric element to correspond generally to the expected frequency band of forces to be applied improves coupling and leads to higher efficiency. The tuning of the resonant frequency of the energy harvester to the available vibration band can be done by several ways, depending on the type of piezoelectric element and how it is supported, including changing the length of the piezoelectric element, increasing the number of layers of the piezoelectric element, adding the mass at the tip of the piezoelectric element, changing the thickness of the electrode layer, changing the thickness of an intermediate metal layer and mounting mechanism.

Oriented within an energy harvesting mechanism are the planes of the dominant modes of deflection or resonance of at least three piezoelectric elements in a mutually orthogonal fashion, thereby defining three coordinate axes, such that there is for each three dimensional coordinate axis at least one of the elements that is sensitive to a vector force applied along each coordinate axis, thereby creating a mechanism sensitive to a force applied in any direction. Such a mechanism is thus able to harvest energy from movement of the mechanism in any direction. It is advantageous for use in applications, for example, in which forces applied by movement of the mechanism, are unpredictable, or in which the orientation of the energy harvesting mechanism cannot be known, set or maintained. Additional piezoelectric elements which are not aligned with three coordinate axes could be included, if found desirable.

For example, by tuning the resonance frequency of the cantilevered piezoelectric elements to relatively low frequencies, typically less than 30 hertz, movement associated with a person moving, which is typically less then 10 hertz, can be harvested and stored. The energy harvesting mechanism can be placed in a powered device carried by the person, without concern for the orientation of the device, or it can be placed on the person, such as in an article of clothing, including a belt or shoe, or placed in or on an item carried by the person, such as a bag, backpack, briefcase, belt clip or holster.

Figure 3:
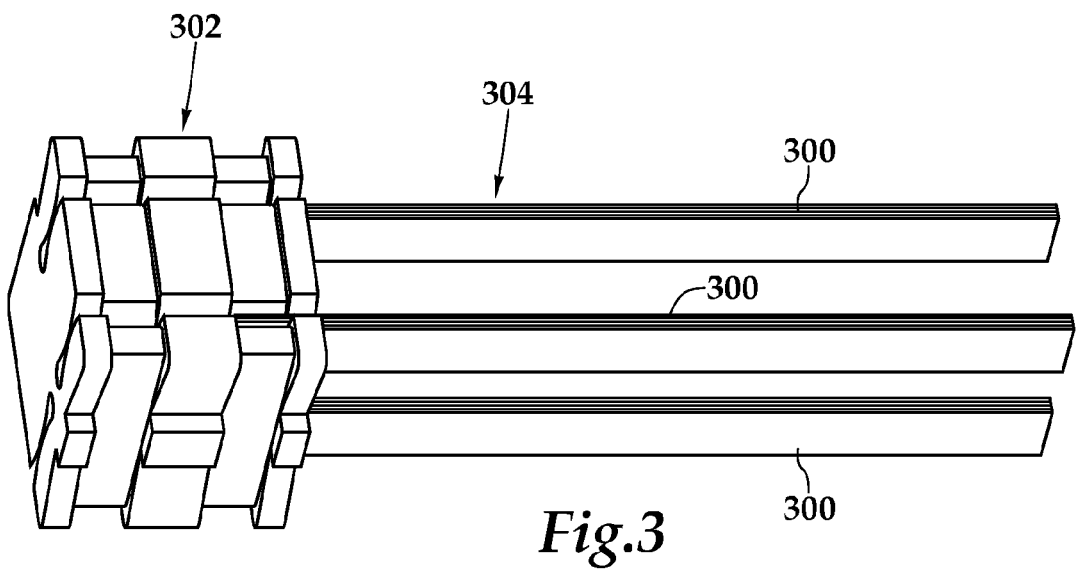
FIG. 3 illustrates a grouping of commonly oriented piezoelectric elements in a clamp.
Figure 4:
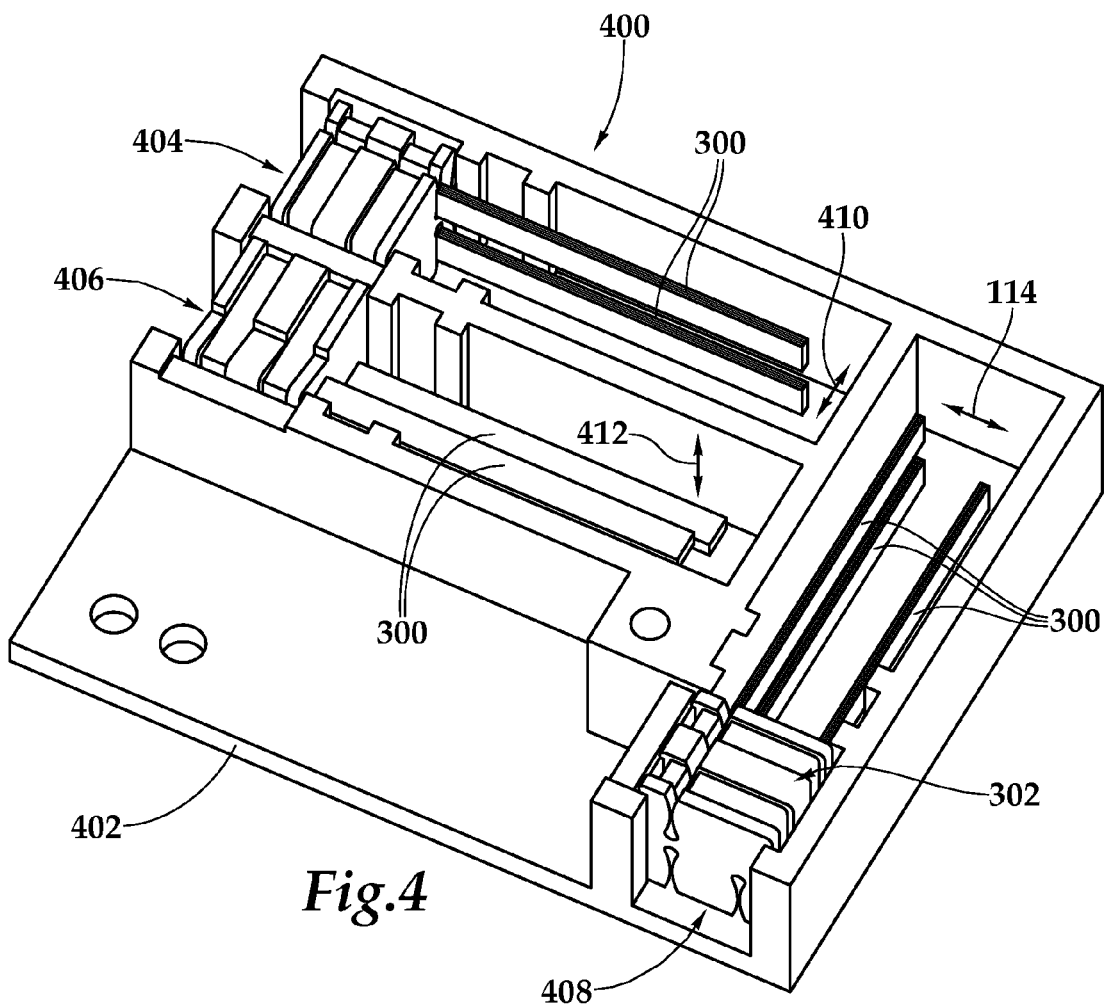
FIG. 4 illustrates an example of a energy harvesting mechanism in a single enclosure using the groupings of piezoelectric elements shown in FIG. 3.

FIGS. 3 and 4 illustrate one example of energy harvesting mechanism or generator. An array of multiple cantilevered piezoelectric elements 300 are anchored or fixed by, for example, a clamp 302 into a grouping 304. All of the elements in the grouping are oriented in the same direction. The piezoelectric elements can be unimorph or bimorph. However, in this example they are thick film bimorphs. Selecting elements with substantially equal resonance frequencies for a grouping and orienting them in the same direction as shown in the drawings permits closer spacing. In such an arrangement, the piezoelectric elements will typically move in unison, in the same direction, in response to a force applied to the structure to which they are fixed or mechanically coupled. Closer spacing permits greater density, resulting in more energy harvested per unit volume. In this example, a lower portion 402 of a case is formed to receive three groupings 404, 406 and 408 of cantilevered piezoelectric elements. Each is substantially the same as the one shown in FIG. 3, but oriented differently. Arrows 410, 412, and 414, respectively, indicate the direction of sensitivity of the cantilevered piezoelectric elements, which correspond to three coordinate axes. A cover mates with the lower portion 402 to form a protective case. Additional energy can be generated by adding additional groupings, and/or by adding more piezoelectric elements to each grouping. Electrical connections and rectifying circuitry are omitted in these figures.

The lower portion of the case 402 serves, along clamps 302, as a fixture for maintaining the respective orientations of the groupings of piezoelectric elements and to couple mechanically the piezoelectric elements to forces from which energy is to be harvested. The case or other fixture or package in which the piezoelectric elements are mounted may also serve to protect the piezoelectric elements and associated circuitry.

Figure 5:
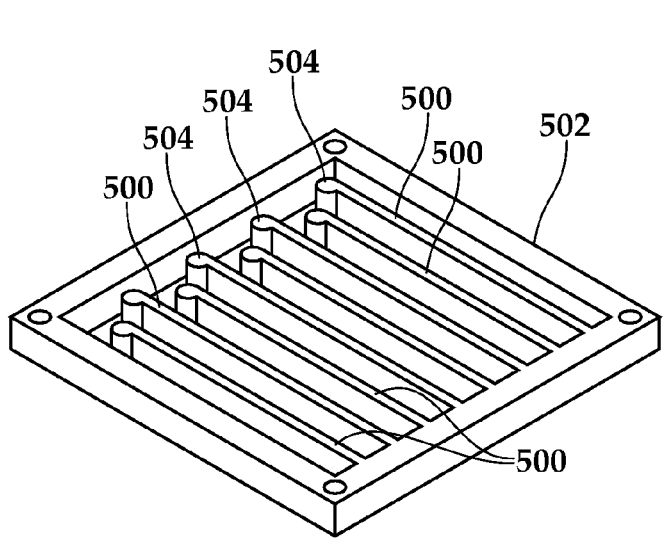
FIG. 5 illustrates an example of a micromachined array of cantilevered piezoelectric elements.
Figure 6:
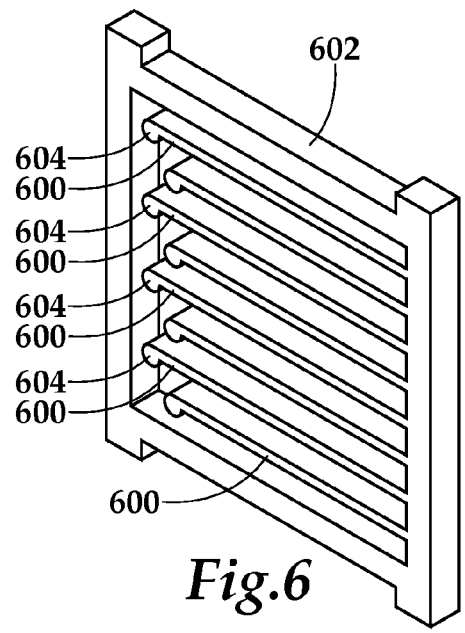
FIG. 6 illustrates a second example of a micromachined array of cantilevered piezoelectric elements.

Referring to FIGS. 5, 6, 7, 8, and 9, increased density and improved manufacturability can be achieved by creating arrays of cantilevered piezoelectric elements from monolithic pieces of ceramic material. As shown in FIGS. 5 and 6, arrays of cantilevered piezoelectric elements 500 and 600 extending, respectively, from frames 502 and 602, are cut from a single slab of piezoelectric ceramic material. A laser, 3-D cutting tools or other micromaching process may be used to cut the design. Before micromaching an electrode pattern is printed on the plates and the ceramic is poled. Frames 502 and 602 differ on the type of structure used for registering the plates to each other and to a base structure. On frame 602 are four extensions or legs 603 on frame 600. Frame 502 includes holes 503. However, different frames or different groupings of frames within a stack can be tuned to be sensitive to different frequencies of force in order to improve coupling. Each of the cantilevered piezoelectric elements 500 and 600 has an added mass 504 and 604, respectively, on its free or tip end in order to lower the resonance frequency. The array of cantilevered elements in each frame includes elements of different lengths.

As shown in FIGS. 7, 8, and 9, frames 500 and 600 are assembled into larger arrays by stacking them on a base 700 in a box-like configuration. Stack 800 is oriented so that its cantilevered piezoelectric elements are most sensitive to vector forces in the direction indicated by arrows 704. Stack 802 is oriented so that its cantilevered piezoelectric elements are most sensitive to vector forces in the direction indicated by arrows 706. Stack 806 is oriented so that its cantilevered piezoelectric elements are most sensitive to vector forces in the direction indicated by arrows 708. Legs 604 are inserted into grooves 702. Bands 900, shown in FIG. 9, hold stack 806 together. A top plate, not shown, is added. The entire structure is preferably encased. Electrical connections are made by strips of silver electrode paint applied to the frames. An electrode on the side of a frame from which the cantilevered elements extend serves as the negative electrode. An electrode on the opposite side of the frame services as the positive electrode. To prevent cantilevered piezoelectric devices in adjacent frames from rubbing against each, each adjacent frame is preferably separated by a small amount. A thin layer of conductive material, such as electrode paint, can be used for this purpose. Since the currents generated by each of the stacks will not be in phase, an insulating material is preferably placed between each of the stacks in order to isolate the circuit for each stack.

Referring now to FIG. 10, in one application the energy harvesting mechanism comprised of the arrays of piezoelectric elements such as shown in FIGS. 3-9 is as a generator 1000 for charging battery 1002. Accumulator 1004 includes circuitry for rectifying the voltage and interfacing with battery 1004 in order to charge the battery.

Figure 11A:
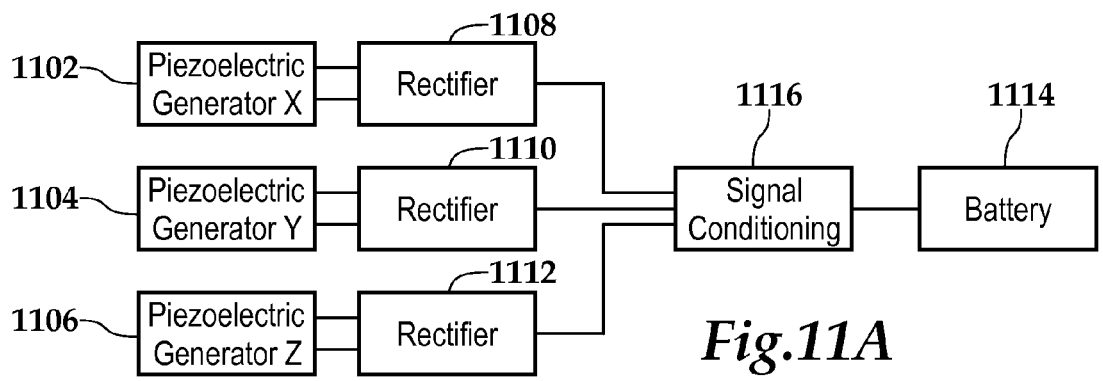
FIG. 11A is an electrical schematic of a circuit for charging the battery using a piezoelectric energy harvesting mechanism, with a signal conditioning element.
Figure 11B:
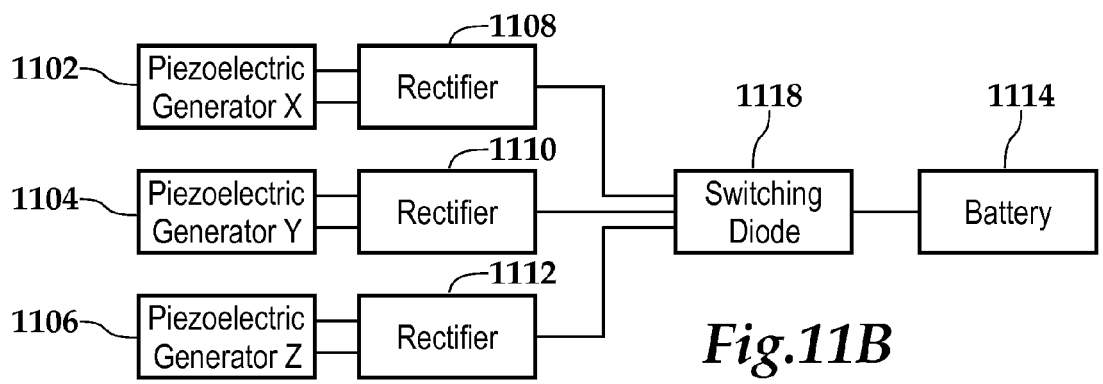
FIG. 11B is an electrical schematic of a circuit for charging the battery using a piezoelectric energy harvesting mechanism, with a switching diode element.

FIGS. 11A and 11B schematically illustrate examples of circuits for use in charging a battery using a generator or energy harvester. Because piezoelectric elements oriented in different directions will generate out of phase currents in response to a given vibration, it is preferred that at least three rectifiers or AC to DC circuits be used, one for each orientation, with the resulting DC currents combined. Piezoelectric generators 1102, 1104, and 1106, each represent all of the piezoelectric elements for the X, Y and Z axes, respectively. Each is coupled to a separate rectifier 1108, 1110 and 1112, respectively. These are preferably full wave rectifiers. If piezoelectric elements for a particular axis have different resonant frequencies, it may be desirable to rectify separately current from piezoelectric elements having different resonant frequencies in order to avoid phase cancellations. The outputs of the rectifiers, which is a DC current, are summed before being used to charge battery 1114.

In FIG. 11A, the DC current is conditioned by conditioning circuit 1116 prior to delivery to the battery. The conditioning circuit generates a charging profile that improves battery charging. The conditioning circuit may comprise converter circuits, including buck-buck converter and/or buck boost converter for modulating the impedance of the circuit. However, in applications in which the current being generated is not relatively consistent or continuous, the conditioning circuit may not provide satisfactory charging. In FIG. 11B, the current is passed through a diode that allows only flow of current to the battery and preferably includes a diode switch 1118 to cut off current below a certain threshold.

Figure 12:
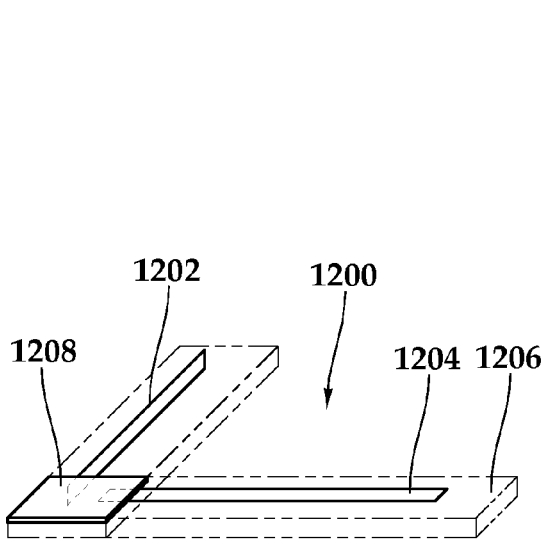
FIG. 12 schematically illustrates another example of a piezoelectric energy harvester.
Figure 13:
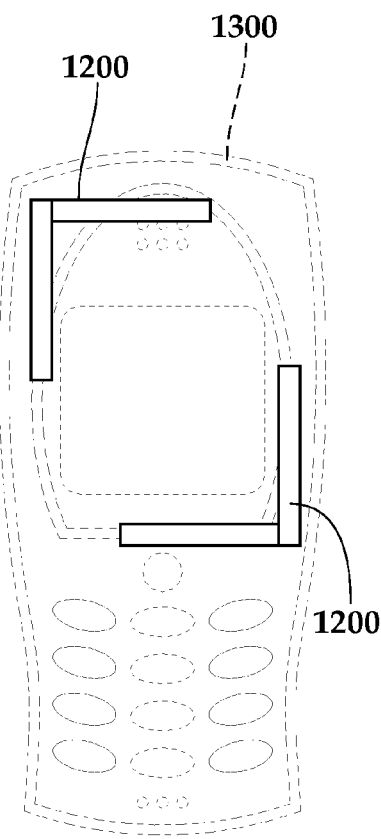
FIG. 13 illustrates deployment of multiple numbers of the piezoelectric energy harvester of FIG. 12 in a mobile device, which is indicated in phantom.

Multiple generators, each with piezoelectric elements mounted along one or two axes can be fixed in a portable device in different orientations. For example, in generator 1200 of FIGS. 12 and 13, two piezoelectric elements 1202 and 1204 are supported in a cantilevered fashion in an "L" arrangement in side enclosures 1206. They are supported by a common base 1208, which supplies the electrical connections to the electrodes on the elements (not shown). In this example, the piezoelectric elements are preferably bimorphs. They are oriented such that their axes are mutually orthogonal and each element's dominant mode of deflection lies in mutually orthogonal planes. Fixing at least two generators 1200 to a portable device, in this example in corners of mobile telephone 1300, in mutually orthogonal orientations, provides for efficient coupling to vector forces from any direction. If a generator includes only piezoelectric elements oriented for bending in the same plane, at least three such generators could be mounted discretely within a device in mutually orthogonal orientations. Distributing multiple numbers of smaller generators in this fashion can permit more efficient utilization of space within a portable device, and avoids a requirement for a single, relatively large volume.

Other techniques for fabricating arrays of piezoelectric elements can be used. In the example of FIGS. 14-17 and 19A-19E, arrays of cantilevered piezoelectric elements, arranged in X, Y and Z coordinate directions, are fabricated from a monolithic semiconductor substrate, such as silicon crystal, using conventional photolithographic and other integrated circuit fabrication techniques. Similar techniques can be used to fabricate piezoelectric elements supported at two or more points.

Referring to FIGS. 14-17, monolithic piezoelectric generator 1400 includes a plurality of arrays 1402 of cantilevered piezoelectric elements 1403 formed to bend primarily along an X axis indicated by arrow 1404, a plurality of arrays 1406 of cantilevered piezoelectric elements 1407 formed to bend primarily along a Y axis indicated by arrow 1408, and a plurality of arrays 1410 of cantilevered piezoelectric elements 1411 formed to bend primarily along a Z axis indicted by arrow 1412. To improve coupling with random movements and vibration of the generator, the arrays in each of the plurality of arrays 1402, 1406, and 1410 may optionally be fabricated with piezoelectric elements tuned to different resonant frequencies. Thus, for example, one "X" axis array would have piezoelectric elements tuned to a one resonant frequency and the other "X" axis would have piezoelectric elements tuned to a different resonant frequency.

Referring now also to FIGS. 18A-18E, which show in detail a cross section of a single cantilever of the monolithic generator 1400 of FIGS. 14-17, the generator is formed on a substrate of silicon crystal 1802 having oxide layer 1804 formed on the bottom and an oxide layer 1806 formed on the top of the substrate, each acting as an electrical insulator. Similar methods have been described in P. Muralt, J. Baborowski, and N. Ledermann, "Piezoelectric MEMS with PZT Thin Films: Integration and Application Issues", pp. 231-260, in Piezoelectric Materials in Devices Ed. Nava Setter, ISBN 2-9700346-0-3, May (2002), Lausanne 1015, Switzerland. A layer of platinum (Pt) 1808 is formed on top of oxide layer 1806. A film of barium titanate ($BaTiO_3$) 1810 is formed on the Pt layer. One method of forming the layer is by spin coating a solution of $BaTiO_3$ on to the Pt layer. The solution is a mixture of a calculated amount of Ba alkoxides dissolved into 2-butoxyethanol and titanium tetra-n-butoxide [$Ti(O—C_4H_9)_4$], which is separately stabilized with acetylacetone [$CH_3COCH_2COCH_3$] and refluxed. After the solution is spin coated onto the wafer, the resulting film is crystallized directly in the diffusion furnace under oxygen atmosphere at various temperatures between 550 and 700° C. The film is then annealed under an oxygen atmosphere.

Figure 18A:
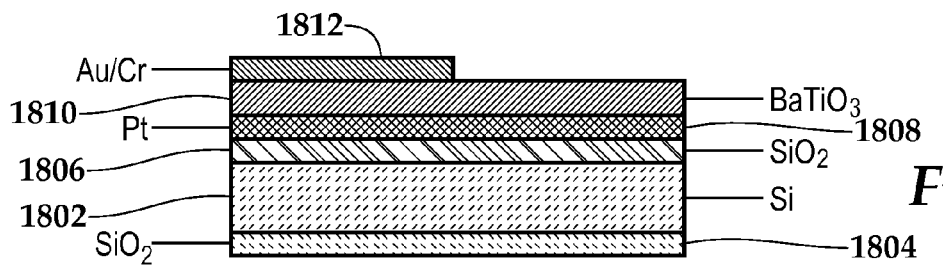
FIGS. 18A-18E illustrate a series of steps of forming piezoelectric elements on the monolithic substrate for the energy harvesting mechanism of FIG. 14.
Figure 18B:
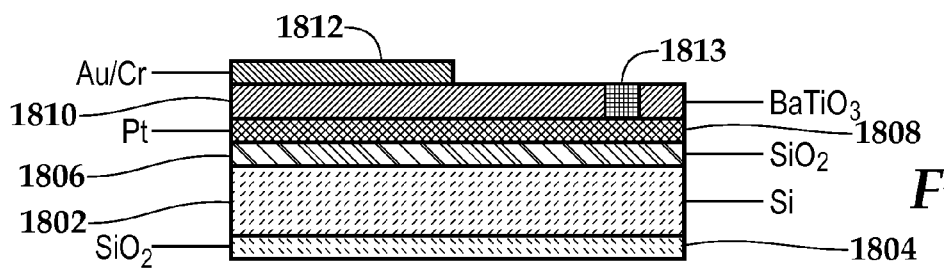
Figure 18C:
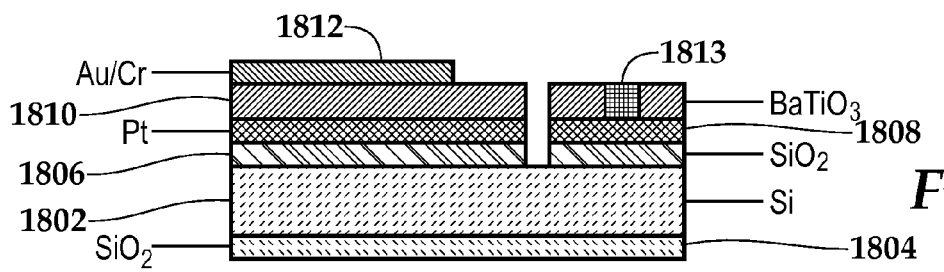
Figure 18D:
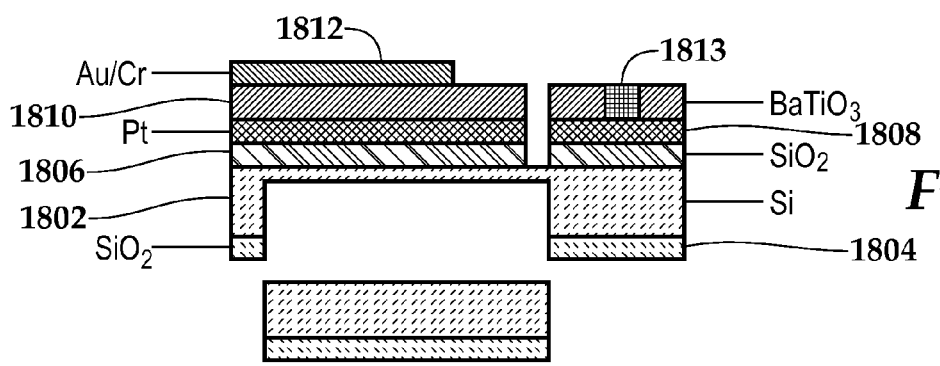
Figure 18E:
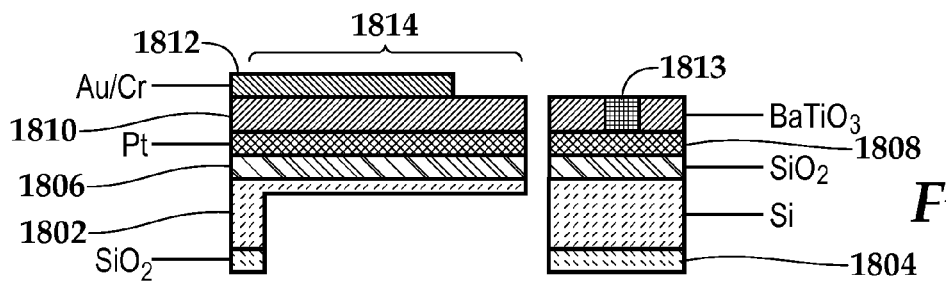

A layer of Au/Cr electrodes 1812 are evaporated and patterned by lift off. Vias 1813 are opened through the $BaTiO_3$ film to give access to the bottom electrode. The narrow slit surrounding the cantilevered section is patterned through the layers of $BaTiO_3$, Pt, and $SiO_2$. The $BaTiO_3$ and Pt films are etched as shown in FIG. 18C by means of, for example, an etchant and ion-beam with photoresist mask. The underlying $SiO_2$ film 1806 is etched with chemical process. The cantilever and beam are released by deep reactive ion etching silicon from the front side, as shown in FIG. 18E. Deep reactive ion etching silicon from the backside is then used to define the thickness of each cantilever section (1-20 µm) 1814.

Figure 19:
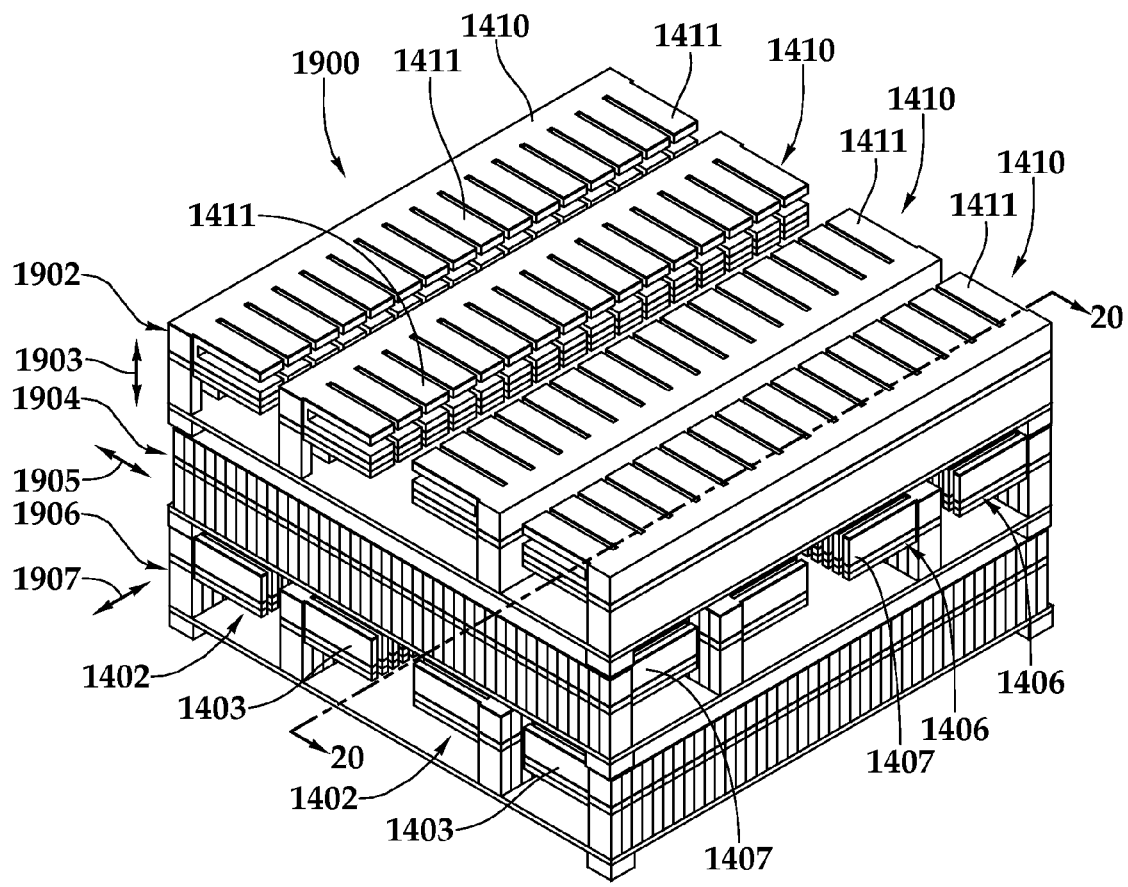
FIG. 19 illustrates schematically a stacked wafer or stacked die embodiment for an energy harvesting mechanism.
Figure 20:
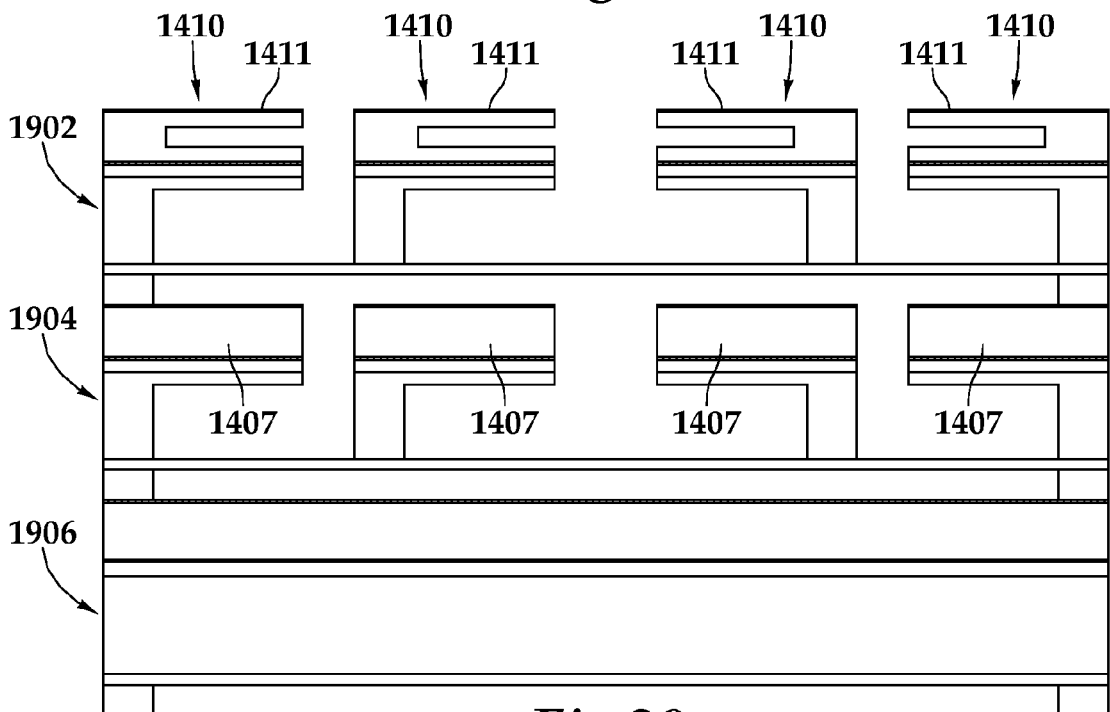
FIG. 20 is a cross-section of FIG. 19 taken along section line 20-20.

As an alternative to fabricating X, Y and Z arrays on a single die of a wafer, these arrays can be fabricated on separate die and stacked, as shown in the example stacked die generator 1900 illustrated in FIGS. 19 and 20. Die 1902 includes only arrays 1410 of cantilevered piezoelectric elements 1411 formed to resonate primarily along the "Z" axis 1903. Similarly, die 1904 includes only arrays 1406 of cantilevered piezoelectric elements 1407 formed to resonate primarily along the "Y" axis 1905. And, die 1906 includes only arrays 1402 of cantilevered piezoelectric elements 1403 formed to resonate primarily along the "Z" axis 1907. X and Y axes die 1904 and 1906 are essentially formed identically, but are assembled with one rotated 90 degrees to the other.

Figure 21:
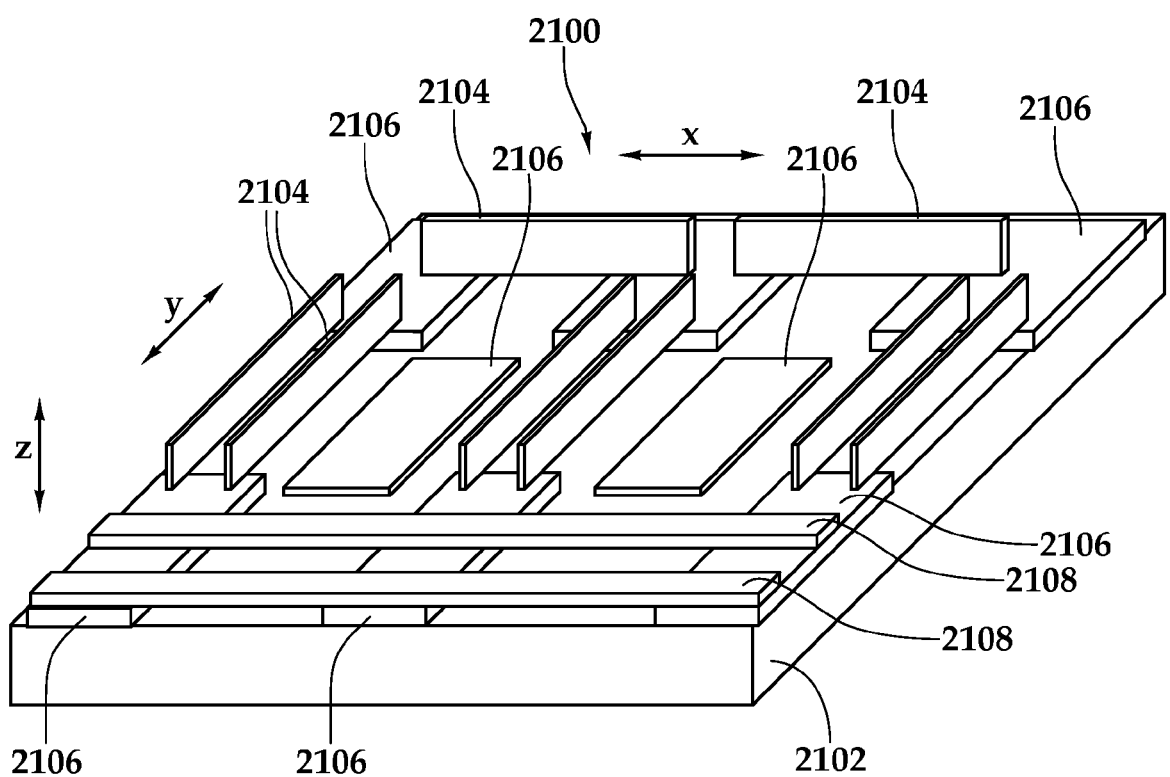
FIG. 21 is an example of an energy harvesting mechanism formed on monolithic substrate using piezoelectric elements supported at two or more points.

FIG. 21 illustrates an energy harvester 2100 formed on a single, monolithic substrate 2102 having a plurality of piezoelectric elements supported at two or more points. Piezoelectric elements 2104 are elongated and generally comparatively wide and thin. They are mounted in a bridge-like fashion, supported at each end by a support pad 2106. Each is fabricated or mounted in an orientation that is sensitive to vector forces along either the "X" or "Y" axis, with dominant modes of resonance in a plane defined by their respective axes and the X or Y axis. Elongated piezoelectric element 2108 is supported at three points by pads 2106 and is sensitive to forces in the "Z" direction. As compared to cantilevered or single point mounting, the span of a piezoelectric element extending between two points does not require as much deflection to create the same amount of strain in the material and, thus, the same amount of voltage. Electrodes (not shown) are placed on opposite sides of the piezoelectric element within the plane of the dominant resonance mode.

The foregoing is a description of exemplary embodiments of the invention as set forth in the appended claims. The scope of the invention is not limited to these embodiments and extends to and includes modifications or improvements, whether by substitution, addition, rearrangement, omission or otherwise, to these embodiments and other structures, processes and mechanisms coming within the scope of the claims.

What is claimed is:

1. An energy harvesting apparatus comprising at least three elongated piezoelectric elements for generating a voltage when strained, each element having an axis extending along its length; each element supported for flexing comparatively easily within a predetermined bending plane as compared to other planes in which its axis lays; a first one of the at least three piezoelectric elements being mounted with its predetermined bending plane facing a first direction, a second one of the at least three piezoelectric elements being mounted with its predetermined bending plane facing in a second direction, and a third one of the at least three piezoelectric elements being mounted with its predetermined bending plane facing a third direction; the first, second and third directions being non-parallel, wherein the at least three elongated, elements comprise a first array of cantilevered, elongated piezoelectric elements with axes oriented in the first direction, a second array of cantilevered, elongated piezoelectric elements with axes oriented in the second direction, and a third array of cantilevered, elongated piezoelectric elements with axes oriented in the third direction, wherein the at least three elongated elements include a sensitivity to at least two different frequencies.

2. The energy harvesting apparatus of claim 1, wherein the first, second and third directions are mutually orthogonal.

3. The energy harvesting apparatus of claim 1, wherein each of the at least three elongated piezoelectric elements has a length at least 10 times the width and the width is at least 5 times the thickness of the elongated piezoelectric elements.

4. The energy harvesting apparatus of claim 3, wherein the mass of at least one of the at least three elongated piezoelectric elements is not evenly distributed along its length, wherein the mass is concentrated in the free end of the elongated piezoelectric elements to lower the resonance frequency.

5. The energy harvesting apparatus of claim 1, wherein at least one of the at least three piezoelectric elements is supported in a cantilevered fashion, with one end fixed and one end free to move, and wherein relatively more mass of the at least one of the at least three elongated piezoelectric elements is distributed near its free end as compared to other locations along its length.

6. The energy harvesting apparatus of claim 1, further comprising at least three AC to DC conversion circuits; a first one of the at least three AC to DC conversion circuits coupled with the first of the at least three piezoelectric elements, a second one of the at least three AC to DC conversion circuits coupled with the second of the at least three piezoelectric elements, and a third one of the at least three AC to DC conversion circuits coupled with the third of the at least three piezoelectric elements.

7. The energy harvesting apparatus of claim 1, wherein the at least three elongated, elements include a difference in dimensions, tip loading, and cascaded electrical connection to be sensitive to a different frequency.

8. The energy harvesting apparatus of claim 7, wherein each of the first, second and third arrays include at least two cantilevered, elongated piezoelectric elements arranged side-by-side and include a different length and tip mass to be sensitive to a different frequency to form the broadband response.

9. The energy harvesting apparatus of claim 7, wherein at least one of the first, second and third arrays of cantilevered, elongated piezoelectric elements are formed on a monolithic semiconductor substrate with a layered arrangement.

10. The energy harvesting apparatus of claim 1, wherein each of the at least three elongated piezoelectric elements are formed on a monolithic semiconductor substrate.

11. The energy harvesting apparatus of claim 1, wherein each of the at least three elongated piezoelectric elements are comprised of a piezoelectric bimorph.

12. The energy harvesting apparatus of claim 1, wherein each of the at least three piezoelectric elements has dimensions and distribution of mass causing it to have a resonance frequency of between 10 and 30 hertz.

13. The energy harvesting apparatus of claim 1, wherein each of the at least three elongated piezoelectric elements is supported at one fixed point in a cantilevered fashion, with one end free to move.

14. The energy harvesting apparatus of claim 1, wherein each of the at least three elongated piezoelectric elements is supported by at least two fixed points, with segments of the element between the fixed points free to flex.

15. A portable device comprising a circuit and a battery for powering at least the circuit, the device electrically coupled with an energy harvester for charging the battery, the energy harvester comprising at least three elongated piezoelectric elements for generating a voltage when strained, each element having an axis extending along its length; each element supported for flexing comparatively easily within a predetermined bending plane as compared to other planes in which its axis lays; a first one of the at least three piezoelectric elements being mounted with its predetermined bending plane facing a first direction, a second one of the at least three piezoelectric elements being mounted with its predetermined bending plane facing in a second direction, and a third one of the at least three piezoelectric elements being mounted with its predetermined bending plane facing a third direction; the first, second and third directions being non-parallel, wherein the three elongated piezoelectric elements include a sensitivity to at least two different frequencies.

16. The portable device of claim 15 wherein the energy harvester further comprises at least three AC to DC conversion circuits; a first one of the at least three AC to DC conversion circuits coupled with the first of the at least three piezoelectric elements, a second one of the at least three AC to DC conversion circuits coupled with the second of the at least three piezoelectric elements, and a third one of the at least three AC to DC conversion circuits coupled with the third of the at least three piezoelectric elements.

17. The portable device of claim 15, wherein the device comprises a mobile telephone.

18. The energy harvesting apparatus of claim 7, wherein the first, second and third arrays are arranged in a multi-axis cantilever array structure on a silicon substrate with layered arrangement to form a cube.

* * * * *